United States Patent
Kuo et al.

(10) Patent No.: US 6,917,249 B1
(45) Date of Patent: Jul. 12, 2005

(54) RC OSCILLATOR

(75) Inventors: James R. Kuo, Cupertino, CA (US); SeungLi Kim, San Francisco, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/305,920

(22) Filed: Nov. 27, 2002

(51) Int. Cl.[7] ................................................. H03K 3/02
(52) U.S. Cl. ...................... 331/143; 331/111; 331/175; 331/177 R; 327/132; 327/172
(58) Field of Search ................................ 331/111, 143, 331/175, 74, 176, 144; 327/132, 172

(56) References Cited

U.S. PATENT DOCUMENTS 5,699,024 A * 12/1997 Manlove et al. ............ 331/111
6,157,270 A * 12/2000 Tso ............................. 331/176
6,356,161 B1 * 3/2002 Nolan et al. ................ 331/176

* cited by examiner

Primary Examiner—Arnold Kinkead
(74) Attorney, Agent, or Firm—Merchant & Gould P.C.; Mark R. Hennings

(57) ABSTRACT

An oscillator has timing characteristics that are determined by resistor and capacitor values. The circuit comprises an astable multivibrator and a current reference. The multivibrator comprises a first and a second timing capacitor. The multivibrator is configured to produce an oscillating output signal in response to charging and discharging the first and the second timing capacitors. The current reference is configured to control the rate of change of charge of the first and second timing capacitors. The current reference is determined in part by the resistor values.

18 Claims, 2 Drawing Sheets

RC OSCILLATOR

FIELD OF THE INVENTION

The present invention relates generally to time base oscillators, and more particularly to oscillators having time bases determined by certain values of resistors and capacitors.

BACKGROUND OF THE INVENTION

Many portable electronic devices use clock signals generated by RC-based oscillators for timing, sequencing, and synchronization. Such devices typically contain low cost processors and memory modules that require clock signals of varying accuracy for proper operation. Many portable electronic devices are battery operated. Battery operation (as well as using power supplies having less than optimum voltage regulation) can affect the accuracy and stability of clock signals generated by oscillators that are dependant upon power supplies having less than optimum stability and regulation.

SUMMARY OF THE INVENTION

The present invention is directed to a circuit for generating an oscillating output signal. According to one aspect of the invention, an oscillator using timing capacitors is provided. The circuit comprises an astable multivibrator and a current reference. The multivibrator comprises a first and a second timing capacitor. The multivibrator is configured to produce an oscillating output signal in response to charging and discharging the first and the second timing capacitors. The current reference is configured to control a rate of change of charge of the first and second timing capacitors.

According to another aspect of the invention, a method for generating an oscillating output signal comprises controlling a rate of change of charge of a first and a second timing capacitor. The output signal is toggled in response to the charge of the first and the second timing capacitor. A regulated current is used to control a rate of charge of the first and second timing capacitors.

A more complete appreciation of the present invention and its improvements can be obtained by reference to the accompanying drawings, which are briefly summarized below, to the following detailed description of illustrated embodiments of the invention, and to the appended claims.

DETAILED DESCRIPTION OF THE PREFERRED EMBODIMENT

Figure 1:
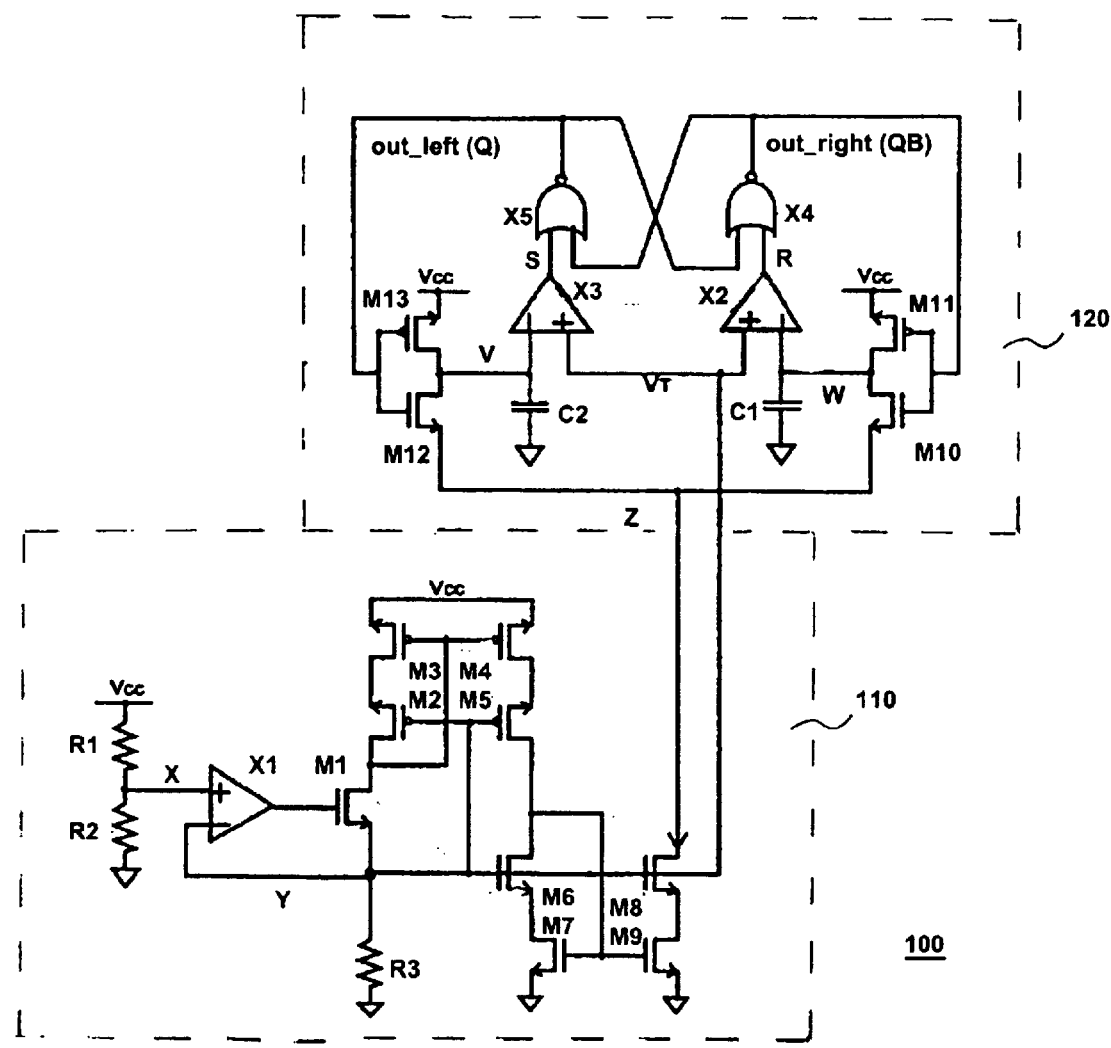
FIG. 1 is an overview schematic of an example battery charging safety circuit system in accordance with the present invention.

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, or data signal. Referring to the drawings, like numbers indicate like parts throughout the views.

The present invention is directed to an oscillator having timing characteristics that are determined by resistor and capacitor values. The circuit comprises an astable multivibrator and a current reference. The multivibrator comprises a first and a second timing capacitor. The multivibrator is configured to produce an oscillating output signal in response to charging and discharging the first and the second timing capacitors. The current reference is configured to control the rate of change of charge of the first and second timing capacitors. The current reference is determined in part by the resistor values.

FIG. 1 is an overview schematic of an example RC oscillator in accordance with the present invention. As shown in the figure, example oscillator 100 comprises current reference 110 and astable multivibrator 120. Current reference 110 comprises resistors R1–R3, transistors M1–M9, and differential amplifier X1. Astable multivibrator 120 comprises capacitors C1–C2, transistors M10–M13, differential amplifiers X2–X3, and logic gates X4–X5. In other embodiments, differential amplifiers X2–X3 may be comparators. Logic gates X4–X5 are shown as NOR gates, although any suitable Boolean equivalents may be used.

Astable multivibrator 120 includes a "right" and a "left" side. The right side comprises capacitor C1, transistors M10–M11, differential amplifier X2, and logic gate X4. The left side comprises capacitor C2, transistors M12–M13, differential amplifier X3, and logic gate X5. The left and right side have typically similar values of components (which produces a duty cycle of around 50%), although differing values can be used (to produce other duty cycles, for example).

Referring now to current reference 110, resistors R1 and R2 are arranged as a voltage divider. The voltage divider produces a voltage reference at node X. Amplifier X1 is arranged to control a current through transistor M1 in response to the voltage reference and threshold voltage VT. The feedback voltage is produced across resistor R3 in response to the current sourced by transistor M1. The feedback voltage is typically offset from the reference voltage. Resistor R3 may be an external component, which allows for programmability.

Transistors M2–M5 are arranged as a current mirror that is configured to produce a first reflected current in response to the transistor M1 current (which flows through node Y). Transistors M6–M9 are arranged as a current mirror that is configured to produce a second reflected current though node Z in response to the first reflected current.

Node Z is arranged to sink current that is produced by the inverters that are formed by transistors M10–M11 and transistors M12–M13 respectively. The inverters are arranged within "left" and "right" feedback loops within multivibrator 120 and are arranged to alternately discharge timing capacitors C1 and C2.

Assuming an initial state where node Q is high and node QB is low, node W is high in response to the state of node QB, and node V is low in response to the state of node Q. Capacitor C1 is charged towards VCC in response to node QB being low, whereas capacitor C2 is being discharged towards VT.

Output node S of amplifier X3 is asserted (i.e., toggles from low to high) in response to capacitor C2 discharging to at least VT. Logic gate X5 negates (i.e., produces a low output) node Q in response to the assertion of node S. Logic gate X4 asserts node QB in response to the negation of node Q. Node V is coupled to VCC in response to the negation of node Q and capacitor C2 begins to charge to VCC. Also in response to the assertion of node QB, node W is coupled to node Z and capacitor C1 begins to discharge to VT.

When capacitor C1 discharges to VT, amplifier X2 asserts output node R. Logic gate X4 negates node QB in response to the assertion of node R. Logic gate X5 asserts node Q in response to the negation of node QB. The negation of node QB, and the assertion of node Q, returns multivibrator 120 to the above assumed initial state. Multivibrator 120 is accordingly astable and repeats the described operation to produce an oscillating signal.

Voltage reference VT that is used as a threshold voltage by multivibrator 120 may be expressed as $$VT = \frac{R2N}{R1+R2} VCC \quad (1)$$

Resistor R1 is typically selected to be greater than resistor R2, which produces a VT that is less than VCC. Maintaining VT to be less than VCC helps to ensure that transistors M10–13 operate within their active regions.

The current flowing through node Z (which is used to sink current from the inverters of multivibrator 120) may be expressed as $$I = \frac{R2N}{R3(R1+R2)} VCC \quad (2)$$

where I is the current flowing through node Z and N is the combined ratio of the current mirrors (formed by transistors M2–M9).

Using Ohm's law, Equation 2 can be used to express VT as $$VT = I \times R3 = \frac{R2N}{(R1+R2)} VCC \quad (3)$$

Also using Equation 2, VCC may be expressed as $$VCC = \frac{R3(R1+R2)}{R2N} I \quad (4)$$

The period of the signal produced at node Q may be expressed as $$\frac{1}{2}T = \frac{Cn}{I}(VCC - VT) \quad (5)$$

where Cn is the average value of capacitors C1 and C2 and T is the period of the signal produced at node Q. Using Equation 3 for VT and Equation 4 for Vcc, Equation 3 may be expressed as $$\frac{1}{2}T = CnR3\left(\frac{R1+R2}{R2N}\right)\left(\frac{R1+R2-R2N}{R1+R2}\right) \quad (6)$$

Simplifying Equation 6 yields $$\frac{1}{2}T = CnR3\left(\frac{R1+(1-N)R2}{R2N}\right) \quad (7)$$

Assuming N=1, Equation 7 may be expressed as $$\frac{1}{2}T = CnR3\left(\frac{R1}{R2}\right) \quad (8)$$

Solving for T, $$T = 2Cn\left(\frac{R3R1}{R2}\right) \quad (9)$$

Using the reciprocal relationship of period to frequency, Equation 9 can be expressed as $$f = \frac{1}{2Cn}\left(\frac{R2}{R3R1}\right) \quad (10)$$

when $f$ is the frequency of node Q (and node QB).

The frequency of oscillator 100 is dependent upon the values of resistors R1–R3 and capacitors C1 and C2 as shown by Equation 10. Moreover, the frequency is theoretically independent of the voltage supply because Equation 10 does not include terms that are related to voltage.

The variation in frequency of oscillator 100 can typically be held to within 5 percent. In an embodiment, resistors R1 and R2 are internal n-well resistors, in which the ratio of the resistors can be accurately controlled using standard CMOS processes. The values of capacitors C1 and C2 can be controlled to within 5 percent of a selected value using standard CMOS processes. The value of resistor R1 is an external resistor in an embodiment, and can be selected to have a value that is within 1 percent of a desired value.

FIGS. 2a–e are exemplary graphs demonstrating signals produced at nodes Y, Z, V, S, and Q respectively in accordance with the present invention. When the voltage at node V falls below VT (due to the discharging of capacitor C2 through node Z), amplifier X3 asserts node S. Node Q is driven low by logic gate X5 in response to the assertion of node S. Transistor M13 conducts in response to the state of node Q, which couples node V to VCC, which in turn charges capacitor C2. Amplifier X3 negates node S in response to the voltage at node V exceeding VT.

Figure 2A:
FIG. 2a is an exemplary graph demonstrating a signal produced at node Y in accordance with the present invention.
Figure 2B:
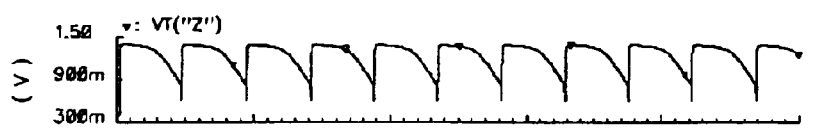
FIG. 2b is an exemplary graph demonstrating a signal produced at node Z in accordance with the present invention.
Figure 2C:
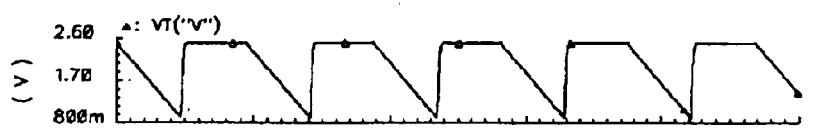
FIG. 2c is an exemplary graph demonstrating a signal produced at node V in accordance with the present invention.
Figure 2D:
FIG. 2d is an exemplary graph demonstrating a signal produced at node S in accordance with the present invention.
Figure 2E:
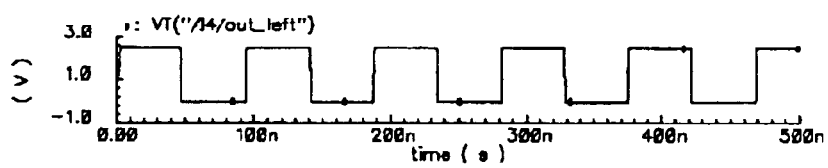
FIG. 2e is an exemplary graph demonstrating a signal produced at node Q in accordance with the present invention.

When node Q is driven low (by logic gate X5 as above), node QB is driven high (not shown). Capacitor C1 discharges through node Z in response to the high state of node QB. Node QB is driven low (not shown) in response to the discharging of capacitor C1. Node Q is driven high in response to node QB being driven low. Transistor M12 conducts in response to the high state of node Q, which causes capacitor C2 to begin to discharge through node Z. When the voltage at node V falls below VT, amplifier X3 again asserts node S as described above. Oscillator 100 accordingly repeats the described operation to produce an oscillating signal. As shown in FIG. 2A, the signal produced at node Y has a stability of about 0.3% in an example embodiment.

The above specification, examples and data provide a complete description of the manufacture and use of the composition of the invention. For example, the cascoding of transistors within the current mirrors may be omitted. Since many embodiments of the invention can be made without departing from the spirit and scope of the invention, the invention resides in the claims hereinafter appended.

We claim:

1. An oscillator, comprising:
    an astable multivibrator that is configured to produce an oscillating output signal in response to charging and discharging of a first and a second timing capacitor and to compare a voltage threshold signal against voltages that are developed in response to charges that are associated with the first and second timing capacitors; and
    an amplifier having an output node that is coupled to an input node of the amplifier and that is coupled to a user-selected resistor, wherein the amplifier is configured to produce a first current that is mirrored to produce a second current that is used to control a rate of change of charge of the first and second timing capacitors and wherein the first current is used to develop the voltage threshold signal.

2. The oscillator of claim 1, wherein the multivibrator further comprises a first and a second differential amplifier, wherein the first amplifier is configured to toggle the oscillating output signal in response to the voltage threshold signal and a first signal that is associated with the charging and discharging of the first capacitor, and wherein the second amplifier is configured to toggle the oscillating output signal in response to the voltage threshold signal and a second signal that is associated with the charging and discharging of the second capacitor.

3. The oscillator of claim 2, wherein the first and second differential amplifiers are comparators.

4. The oscillator of claim 1, wherein the multivibrator further comprises a first and second inverter, wherein the first inverter is configured to alternately cause the first capacitor to charge and discharge, and wherein the second inverter is configured to alternately cause the second capacitor to charge and discharge.

5. The oscillator of claim 1, wherein the amplifier further comprises a current mirror.

6. The oscillator of claim 4, wherein the amplifier further comprises a voltage reference.

7. The oscillator of claim 5, wherein the user-selected resistor is configured to control a voltage threshold signal.

8. A method for generating an oscillating output signal, comprising:
    comparing a voltage threshold signal against voltages that are developed in response to charges that are associated with a first and a second timing capacitor;
    coupling an output node of an amplifier to an input node of the amplifier, wherein the output node of the amplifier is configured to produce a first voltage;
    using the first voltage to produce a first current that is mirrored to produce a second current;
    developing the voltage threshold signal in response to the first current;
    toggling the oscillating output signal in response to the charge of the first and the second timing capacitor; and
    using the second current to control the rate of change of charge for the first and second timing capacitors.

9. The method of claim 8, further comprising:
    toggling the output signal in response to the voltage threshold signal and a first signal that is associated with the charge of the first capacitor; and
    toggling the output signal in response to the voltage threshold signal and a second signal that is associated with the charge of the second capacitor.

10. The method of claim 8, further comprising regulating a regulated current in response to the voltage threshold signal.

11. The method of claim 10, further comprising using a current mirror to generate the regulated current.

12. A circuit for generating an oscillating output signal, comprising:
    means for comparing a voltage threshold signal against voltages that are developed in response to charges that are associated with a first and a second timing capacitor;
    an amplifier means having an output node coupled to an input node, wherein the amplifier means produces a voltage reference signal;
    means for producing a first current in response to the voltage reference signal;
    a mirror means for producing a second current in response to the first current;
    means for controlling a rate of change of charge of the first and the second timing capacitor in response to the second current; and
    means for toggling the oscillating output signal in response to the charging and discharging the first and the second timing capacitor.

13. The circuit of claim 12, further comprising:
    means for toggling the oscillating output signal in response to the voltage threshold signal and a first signal that is associated with the charge of the first capacitor; and
    means for toggling the output signal in response to the voltage threshold signal and a second signal that is associated with the charge of the second capacitor.

14. The circuit of claim 12, further comprising means for regulating the regulated current in response to the voltage threshold signal.

15. The circuit of claim 14, further comprising a user-selected resistor that is configured to determine the voltage threshold signal.

16. An oscillator, comprising:
    an astable multivibrator that is configured to produce an oscillating output signal in response to charging and discharging of a first and a second timing capacitor wherein the astable multivibrator changes states in response to comparing a voltage threshold signal against voltages that are developed in response to charges that are associated with the first and second timing capacitors;

an amplifier having a first output that is coupled to a transistor that is configured to produce a first current at a first node wherein the first node is coupled to an input of the amplifier;

a resistor that is coupled to the input of the amplifier and configured to produce the voltage threshold signal in response to the first current; and a current mirror that is configured to mirror the first current to produce a second current by which the first and second timing capacitors are charged and/or discharged.

17. An oscillator, comprising:

an astable multivibrator that is configured to produce an oscillating output signal in response to charging and discharging of a first and a second timing capacitor;

an amplifier that is configured to produce a voltage reference signal, wherein the amplifier comprises a first input that is coupled to a user-selected resistor and that is coupled to an output node of the amplifier, wherein a voltage threshold signal controls the frequency of the astable multivibrator, and wherein the value of the user-selected resistor controls the voltage threshold signal; and a current reference that is responsive to the output of the amplifier to control a rate of change of charge of the first and second timing capacitors.

18. The oscillator of claim 17, wherein the user-selected resistor is not located on a chip that comprises the oscillator.

* * * * *

UNITED STATES PATENT AND TRADEMARK OFFICE
CERTIFICATE OF CORRECTION

PATENT NO. : 6,917,249 B1 Page 1 of 1
APPLICATION NO. : 10/305920
DATED : July 12, 2005
INVENTOR(S) : James R. Kuo et al.

It is certified that error appears in the above-identified patent and that said Letters Patent is hereby corrected as shown below:

<u>Column 4,</u>
Line 15, change "Vcc" to -- VCC --.
Line 44, change "when" to -- where --.

Signed and Sealed this

Twentieth Day of June, 2006

JON W. DUDAS
*Director of the United States Patent and Trademark Office*